US005641961A

United States Patent [19]
Irwin et al.

[11] Patent Number: 5,641,961
[45] Date of Patent: Jun. 24, 1997

[54] APPLICATION OF ELECTROTHERMAL FEEDBACK FOR HIGH RESOLUTION CRYOGENIC PARTICLE DETECTION USING A TRANSITION EDGE SENSOR

[75] Inventors: Kent D. Irwin, Boulder, Colo.; Blas Cabrera, Stanford, Calif.

[73] Assignee: Stanford University, Stanford, Calif.

[21] Appl. No.: 579,740

[22] Filed: Dec. 28, 1995

[51] Int. Cl.⁶ ................................................. G01T 1/00
[52] U.S. Cl. ............................................... 250/336.2
[58] Field of Search ......................... 250/336.2; 374/176; 437/3

[56] References Cited

U.S. PATENT DOCUMENTS 5,090,819  2/1992  Kapitulnik ........................ 374/176
5,264,375  11/1993  Bang et al. ........................ 437/3

*Primary Examiner*—Michael J. Tokar
*Assistant Examiner*—Richard Hanig
*Attorney, Agent, or Firm*—Lumen Intellectual Property Services

[57] ABSTRACT

A novel type of superconducting transition edge sensor is described. The sensor comprises a primary heat sink maintained at a constant temperature and a resistive means, such as a superconducting film, in thermal contact with the primary heat sink. The temperature of the primary heat sink is kept well below the transition temperature of the superconducting film. The film is voltage biased, so that its temperature is maintained within its superconducting transition through electrothermal feedback: at equilibrium, the Joule heating of the film is equal to the heat loss from the film to the substrate. The energy deposited in the film by a particle incident on the sensor is measured by the reduction in Joule heating.

20 Claims, 5 Drawing Sheets

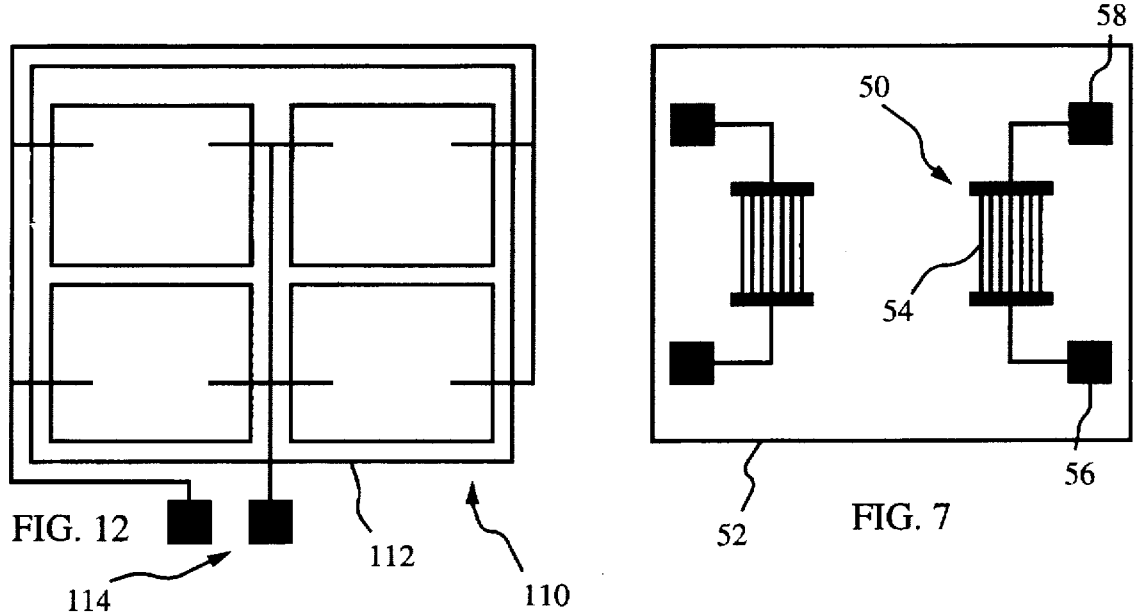
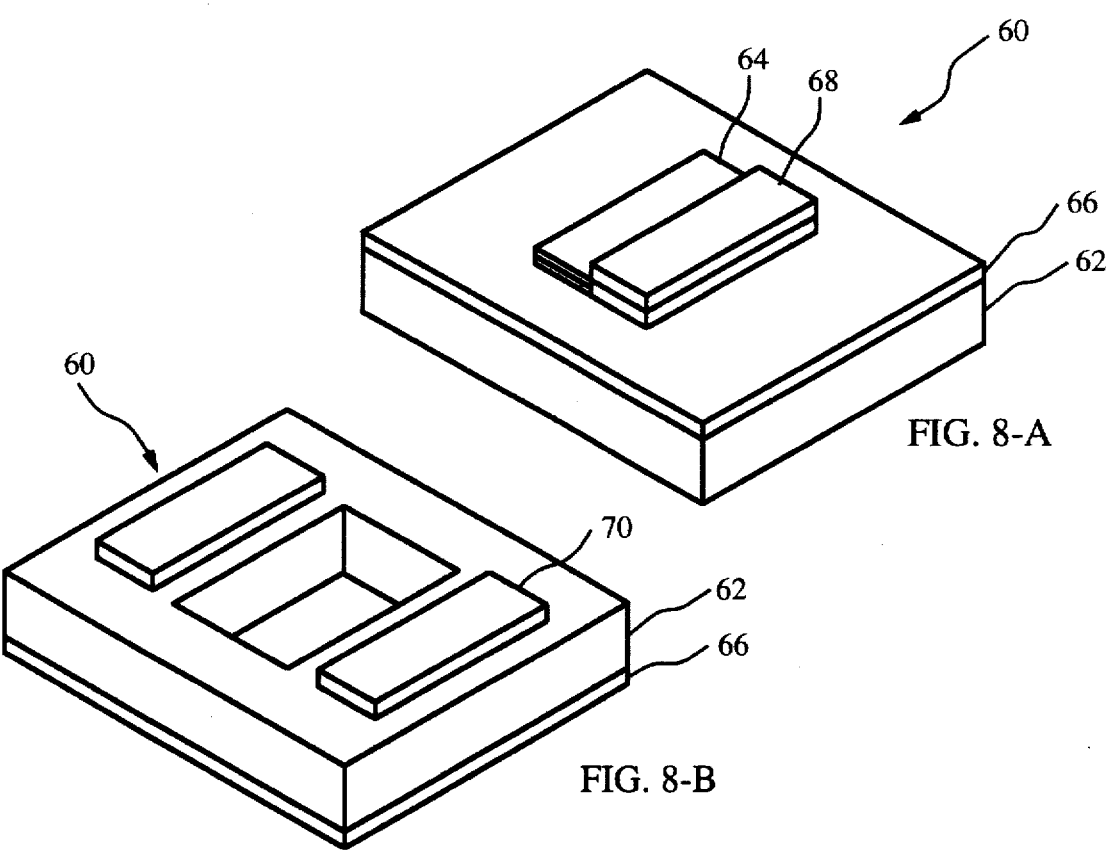

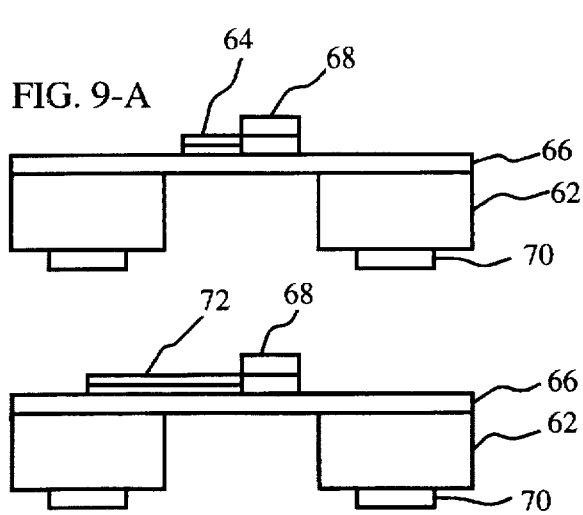
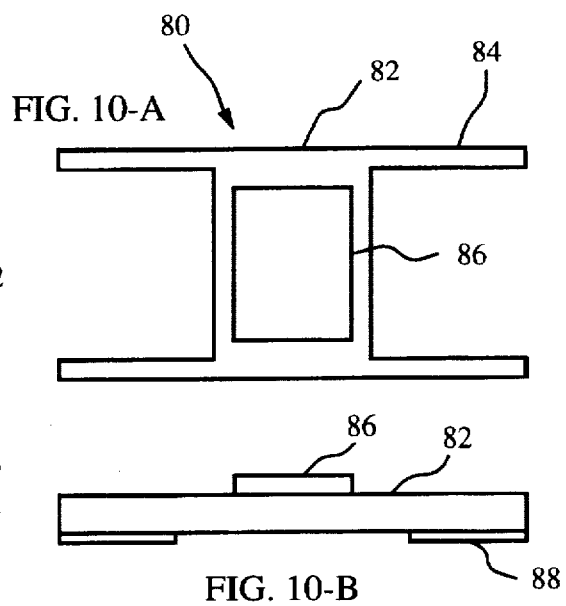
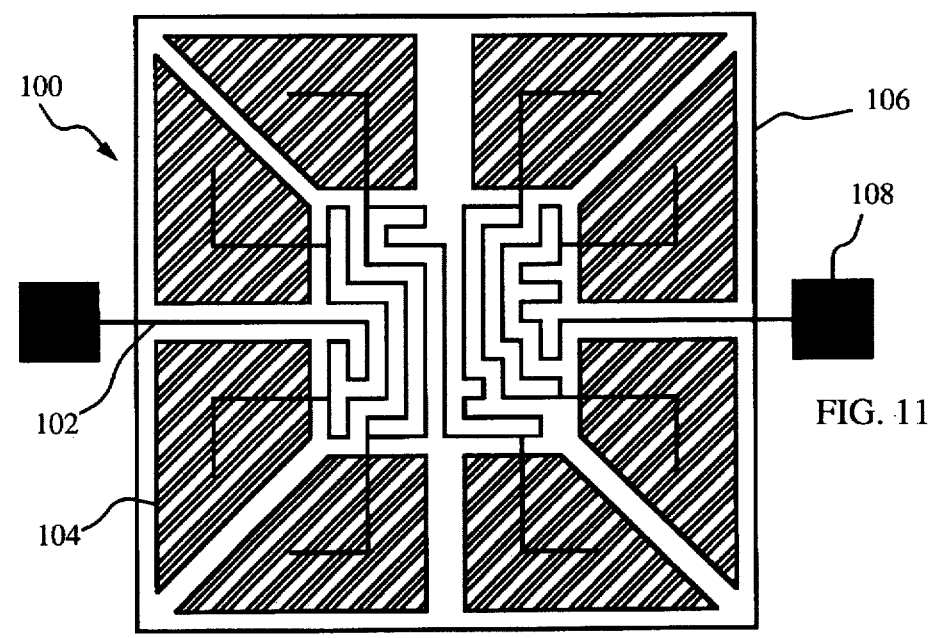

APPLICATION OF ELECTROTHERMAL FEEDBACK FOR HIGH RESOLUTION CRYOGENIC PARTICLE DETECTION USING A TRANSITION EDGE SENSOR

BACKGROUND—FIELD OF THE INVENTION

The present invention relates to the field of cryogenic particle detection, and in particular to a superconducting transition edge sensor using electrothermal feedback.

BACKGROUND—DESCRIPTION OF PRIOR ART

High resolution thermal particle detectors have many applications, including X-ray spectroscopy for materials science, X-ray astronomy, infrared bolometry, the detection of eV-scale photons, and the measurement of the kinetic energy of thermal atoms. An important goal in the design of such detectors has been the reduction of noise, and the resulting improvement in the resolution of the detectors.

Several types of thermal detectors have been discussed before. For a review of bolometer noise theory, see for example the article by J. C. Mather in *Applied Optics*, v. 21, no. 6, p. 1125–1129, 1982. Also, S. H. Moseley et al. discuss the use of thermal detectors for X-ray spectrometry in *J. Appl. Physics*, v. 56, no. 5, p.1257–1262, 1984. Briefly, most detectors measure the energy deposited by a particle in an absorber, assuming the energy is subsequently thermalized.

A particularly useful type of thermal particle detector is the transition edge sensor (TES), a detector whose active element is biased within its superconducting transition region. The active element is usually a superconducting film maintained within its transition. Typically, the film is in thermal contact with a heat sink and in some sensors with an absorber. A particle incident on the sensor is absorbed either in the absorber, or directly in the film, and consequently deposits energy in the film. The deposited energy thermalizes, and is determined from the temperature rise of the superconducting film.

For example, M. Frank et al. (*Nucl. Instr. Meth.*, v. A345, p.367–378, 1994) describe a superconducting phase transition thermometer using an iridium film. The detector has a substrate in thermal contact with a heat bath (refrigerator) on one side, and with the iridium film on the other. The temperature of the substrate is nearly equal to that of the film. The substrate and the film are maintained within the superconducting transition of the film by balancing the constant Joule heating of the film and the heat transfer from the substrate to the heat bath. In the apparatus described by Frank et al., with certain simplifying assumptions, the temperature rise of the film following an event is $\Delta T(t)=(E/C)\exp(-t/\tau)$, where E is the energy of the incident particle, C is the heat capacity of the substrate, and $\tau=C/g$ is the decay time of the pulse, determined by the thermal conductance g between the substrate and the heat bath. The film effectively acts as a thermometer measuring the temperature of the substrate. A particle incident on the substrate produces a rise in the temperature of the substrate, which in turn causes the film to heat up. The temperature rise of the film is measured from the change in its resistance.

An important feature of the detector described by Frank et al. is that the pulse decay time $\tau$ is determined by the heat flow from the substrate to the heat bath, and not by the Joule heating of the film. The detector is particularly designed so that the Joule heating of the film stays constant following an event.

However, the sensor described by Frank et al., as well as other previously described superconducting transition edge sensors (TES), are sensitive to imperfections such as transition nonlinearities and film nonuniformities. Moreover, the pulse decay times determined by heat flow to the heat bath are relatively large, and consequently lead to limited count rates.

OBJECTS AND ADVANTAGES OF THE INVENTION

It is a primary object of the present invention to provide a thermal particle detector with improved resolution and count rate. It is yet another object of this invention to provide a detector relatively insensitive to transition nonlinearities and film nonuniformities. These and other objects and advantages will become more apparent after consideration of the ensuing description and the accompanying drawings.

SUMMARY OF THE INVENTION

The objects and advantages of the present invention are achieved with a superconducting transition edge sensor using electrothermal feedback. The sensor comprises a primary heat sink such as a substrate, a variable resistor made of a superconducting material deposited on the substrate, and a current sensing means such as a DC SQUID array for measuring the current through the variable resistor. The substrate is cooled well below the transition temperature of the resistor. The resistor is voltage biased, and the bias voltage is chosen such that the resistor is maintained within its superconducting transition region by electrothermal feedback. The energy deposited in the resistor by incident particles or radiation is measured by the reduction in the feedback Joule heating.

BRIEF DESCRIPTION OF THE DRAWINGS

FIG. 2-A is a view of the top side of the sensor of FIG. 1.

FIG. 2-B is a view of the bottom side of the sensor of FIG. 1.

FIG. 7 shows another embodiment of the present invention, in which the resistive means comprises strips of metal deposited on said substrate.

FIG. 8-A is a perspective view showing the top side of another embodiment of the present invention.

FIG. 8-B is a perspective view showing the bottom side of the sensor of FIG. 8-A.

FIG. 9-A is a view of a side section through the middle of the sensor of FIG. 8-A.

FIG. 9-B is a side sectional view of a sensor similar to the one shown in FIG. 9-A.

FIG. 10-A is a top view of yet another embodiment of the present invention.

FIG. 10-B is a side view of the sensor shown in FIG. 10-A.

FIG. 11 is a top view of an element of a quasiparticle-trap-assisted electrothermal feedback transition edge sensor (QET), according to the present invention.

FIG. 12 is a top view of a QET comprising an array of elements similar to the one shown in FIG. 8.

DESCRIPTION

Figure 1:
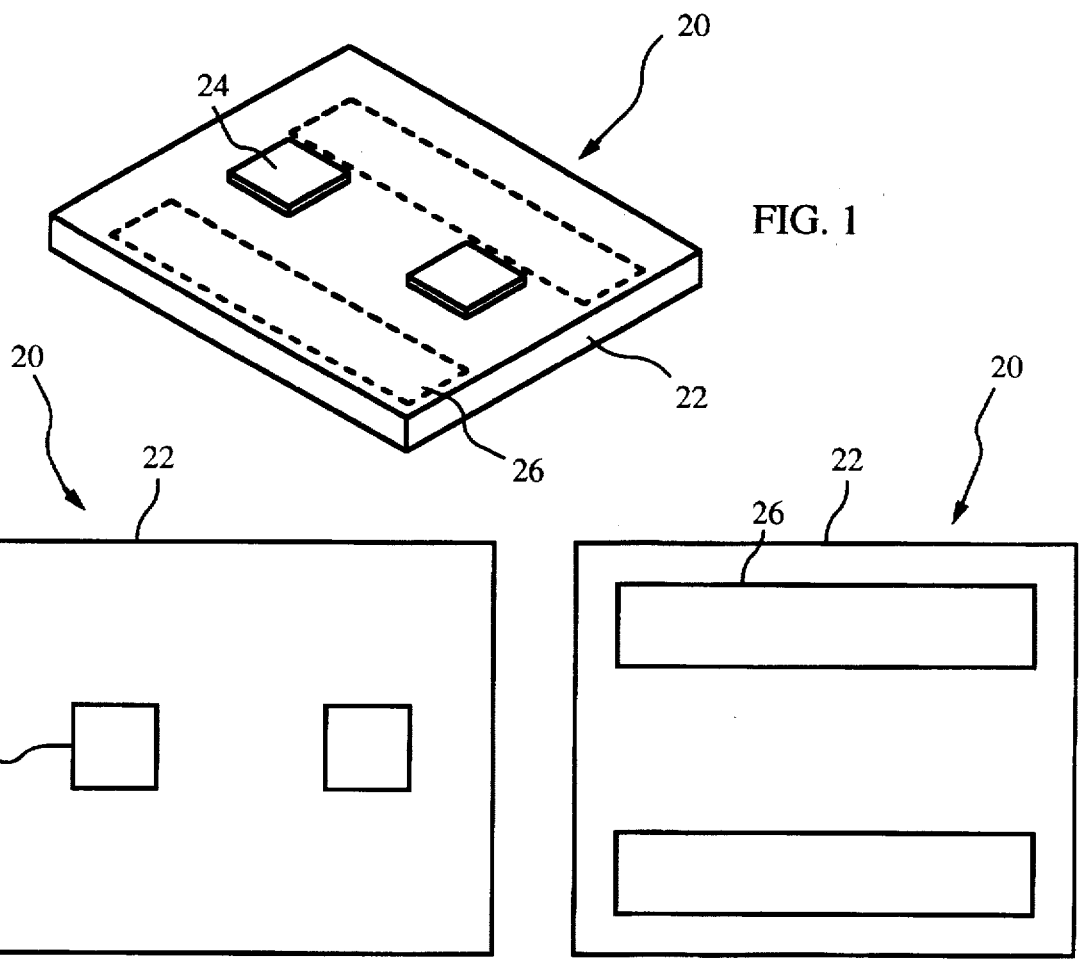
FIG. 1 is a perspective view of a superconducting transition edge sensor of the present invention.

In a superconducting transition edge sensor (TES) of the present invention, a resistive means made of a superconducting material is in thermal contact with a primary heat sink maintained at a constant temperature. The primary sink can be, in turn, in thermal contact with a secondary heat sink. The resistive means can also be in thermal contact with an absorber adapted to absorb the particles or radiation of interest. In a preferred embodiment, the resistive means is a superconducting film, the primary heat sink is a substrate, the secondary heat sink is the cold plate of a cryogenic refrigerator, and the absorber is made of a normal metal or semimetal. The film is voltage biased, and the substrate is cooled to well below the film transition temperature. The voltage bias V can be chosen so that the film self-regulates within its transition region: as the film cools, its resistance R drops toward zero, and the Joule heating ($P=V^2/R$) increases. A stable equilibrium is established when the Joule heating of the film matches the heat loss from the film to the substrate.

As a consequence of the interaction of the particle with the sensor, the temperature of the film rises, causing an increase in the film resistance and a decrease in Joule heating. After a characteristic time $\tau_{ef}$ all the heat deposited by the particle in the film is removed by a reduction in Joule heating. The time $\tau_{ef}$ depends on the sharpness of the film superconducting transition and on the primary heat sink temperature, and it is designed to be much smaller than $\tau_o$, the characteristic time of the heat loss to the primary heat sink. The condition $\tau_{ef}<<\tau_o$ ensures that the energy deposited by a particle in the film is approximately equal to the reduction in feedback Joule heating, i.e. that the increase in the heat loss to the primary heat sink over a time scale of $\tau_{ef}$ is small.

The TES can be modeled as a film of heat capacity C thermally connected to a primary heat sink held at a constant temperature $T_1$. The temperature $T_2$ of the film is determined by the equilibrium condition that the Joule heating equals the heat loss to the primary heat sink. The heat loss to the heat sink varies as $K(T_2^n - T_1^n)$, where K is a parameter depending on the materials and geometry of the sensor, and n is a number whose value depends on the dominant thermal impedance between the primary heat sink and the electrons in the superconducting film. The exponent n can take values between 2 and 6, depending on the design of the sensor.

When an event heats the film a small amount above the equilibrium temperature, the return to equilibrium is described by $$C\frac{d\Delta T_2}{dt} = -\frac{P_o\alpha}{T}\Delta T_2 - g\Delta T_2 \quad [1]$$

where the first term on the right hand side represents the effect of reduced Joule heating, and the last term represents the increased heat flow to the primary heat sink. The parameter $g=dP/dT=nKT^{n-1}$ is the thermal conductance between the film and the primary heat sink, $\alpha=(T/R)(dR/dT)$ is a unitless measure of the sharpness of the superconducting transition of the film, and $P_o$ is the equilibrium Joule power.

When the primary heat sink is much colder than the film, $P_o=KT^n=gT/n$, the pulse recovery time constant $\tau_{ef}$ is $$\tau_{ef} = \frac{\tau_o}{1+\alpha/n} \quad [2]$$

where $\tau_o=C/g$ is the intrinsic time constant of the film, i.e. the pulse recovery time constant in the absence of Joule heating.

As can be seen from equation [2], the superconducting transition sharpness $\alpha$ is a crucial parameter for a TES of the present invention. In order to shorten $\tau_{ef}$ and to ensure that $\tau_{ef}<<\tau_o$, it is desirable to make $\alpha$ as high as possible, i.e. to use a superconductor with a sharp transition region. It is known in the art that very low-$T_c$ superconducting films can be fabricated with $\alpha$ as high as 1000. Thus, the pulse recovery time for a TES of the present invention can be shorter by two orders of magnitude than that of a conventional calorimetric particle detector, allowing for an increased count rate.

If $\tau_{ef}<<\tau_o$ the energy deposited in the film by an incident particle or radiation is removed primarily by a reduction in Joule heating rather than by increased heat loss to the substrate. Then, the energy of an incident particle is approximately equal to the time integral of the change in Joule power:

$$E = -\int \Delta P_{Joule} dt = -V_o \int \Delta I dt \quad [3]$$

Nonuniformities in the film properties and nonlinearities in the resistive transition will affect the pulse shape, but not the pulse integral. Moreover, the dynamic range of the sensor is improved: even if the film is driven completely normal, the total energy is still measured, assuming that $\tau_{ef}<<\tau_o$ and that the film can recover to its transition region between pulses.

The energy resolution of a TES of the present invention is ultimately limited by thermodynamic energy fluctuations in the detector (phonon noise), and the Johnson noise of the film. For a detailed treatment of the noise in TES, see for example the above-mentioned article by Mather, and the article by K. D. Irwin in Appl. Phys. Lett., v. 66 no. 15, p. 1998–2000, 1995, which is hereby incorporated by reference. Briefly, the fundamental resolution limit is shown to be $$\Delta E_{FWHM} = 2.36 \Delta E_{RMS} = 2.36\sqrt{4kT_2^2C(1/\alpha)}\sqrt{n/2} \quad [4]$$

for a TES using electrothermal feedback, and when optimal filter theory is applied to an exponential pulse in the presence of a calculated noise spectrum containing Johnson and phonon noise. As can be seen from equation [4], resolution can be improved by using a film with a low transition temperature, low heat capacity C, and a sharp superconducting transition (i.e. high $\alpha$). For a tungsten film with a 70 mK transition, and heat capacity chosen so that a 6 keV X-ray drives it through one tenth of a transition width, the fundamental limit on energy resolution is less than 1.2 eV FWHM, with a count rate of 50 kHz.

Figure 3:
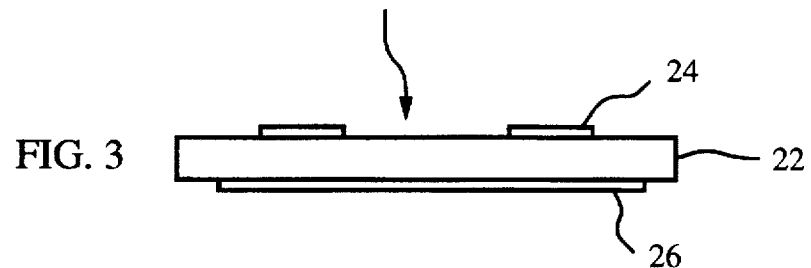
FIG. 3 is a side view of the sensor of FIG. 1.

There are many ways to build a TES that uses electrothermal feedback (ETF-TES). FIG. 1 shows in perspective one embodiment of the present invention, an ETF-TES 20. TES 20 comprises a substrate 22 acting as the primary heat sink, a resistive means 24 for measuring the energy of incident particles, and a thermal contact means 26 for providing contact between substrate 22 and a secondary heat sink (not shown); the secondary heat sink can be, for example, a metal plate of a dilution refrigerator. Preferably, resistive means 24 and thermal contact means 26 are thin electrically conducting films deposited on substrate 22. Resistive means 24 is preferably made of a material with a sharp superconducting transition; such a material can be for example tungsten, or a bilayer consisting of a superconducting and a normal film, such as an Al-Ag, Ir-Au, Al-Cu or Al-Au bilayer. Thermal contact means 26 is made of a good thermal conductor, such as gold. FIG. 2-A is a top view of TES 20, showing resistive means 24. FIG. 2-B is a bottom view of TES 20, showing thermal contact means 26. FIG. 3 is a side view of TES 20. X-rays are incident on TES 20 from the bottom. TES 20 also comprises a current sensing means, not shown in FIG. 1–3 for simplicity.

Figure 4:
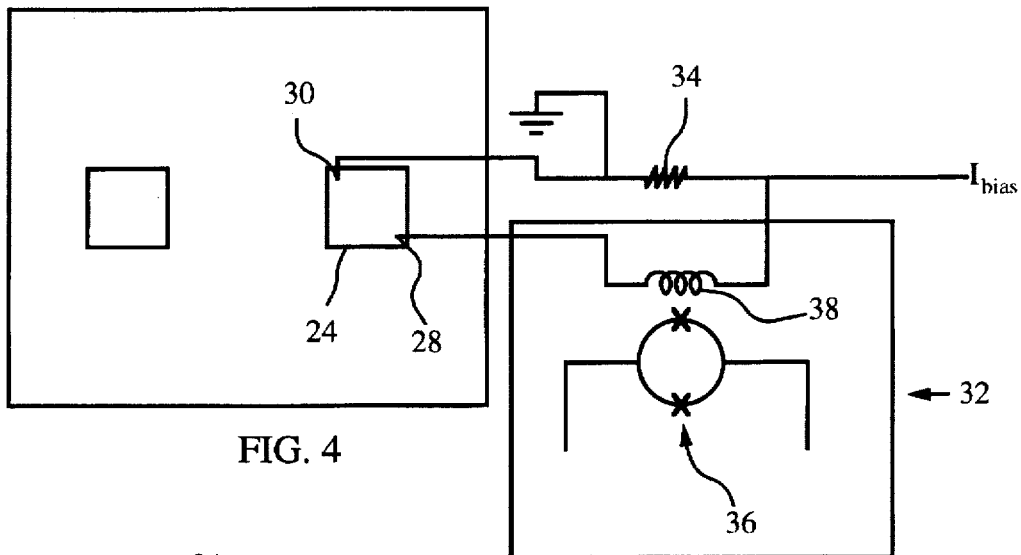
FIG. 4 is a schematic diagram of the electrical connections of the sensor, according to the present invention.

Resistive means 24 has an electrical input 28 and an electrical output 30, as shown schematically in FIG. 4. The current through resistive means 24 is measured using a current sensing means 32. In a preferred embodiment, current sensing means 32 comprises a DC SQUID. Resistive means 24 is voltage biased by applying a current bias $I_b$ to a circuit containing a shunt resistor 34 in parallel with resistor 24. The resistance $R_s$ of shunt resistor 34 is chosen to be much smaller than expected values of the resistance of resistor 24. It is evident that resistor 24 can also be voltage biased by directly applying a constant voltage to input 28; in such a case, a shunt resistor would not be necessary. The voltage bias is selected from a range such that resistor 24 self-biases within its transition.

Figure 5:
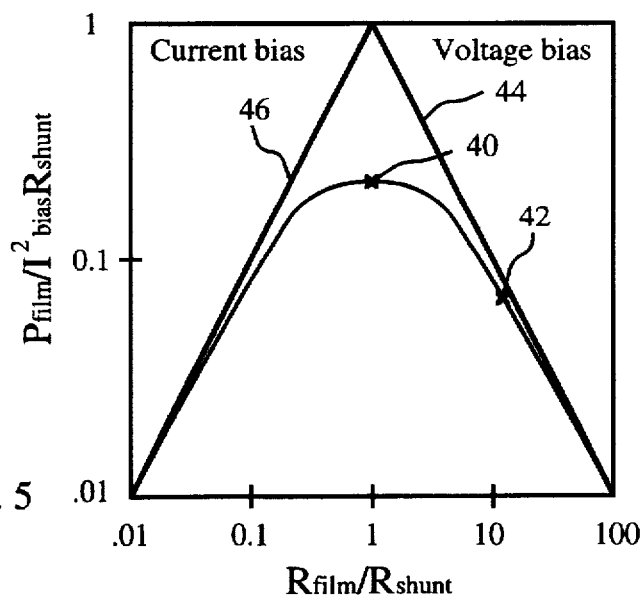
FIG. 5 shows the dependence of the power dissipated in the resistive film as a function of its resistance, for a fixed shunt resistance and bias current.

The dependence of the Joule power dissipated in the resistive means 24 on the resistance of resistor 24 is shown qualitatively in FIG. 5, for a sensor having the electrical connections shown in FIG. 4, and for a fixed shunt resistance $R_s$ and bias current $I_{bias}$. If it is desired that the Joule power dissipated in resistor 24 vary as little as possible with the resistance $R_{film}$ of resistor 24, the shunt resistance $R_{shunt}$ is chosen to be approximately equal to the expected value of the resistance $R_{film}$. The calorimetic particle detector described by Frank et al. has bias values of $R_{film}$ about equal to $R_{shunt}$, corresponding approximately to the point 40 in FIG. 5; in such a detector, the Joule power dissipated in resistor 24 changes little following an event heating up the film. For a detector of the present invention, $R_{film}$ and $R_{shunt}$ are preferably chosen to correspond to a point such as point 42 in FIG. 5, i.e. $R_{shunt}$ is chosen to be smaller than $R_{film}$. If $R_{shunt}<R_{film}$, the detector is voltage biased; in the limit of $R_{shunt}<<R_{film}$, the Joule power dissipated in resistor 24 as a function of the resistance $R_{film}$ approaches the line 44, where line 44 corresponds to perfect voltage biasing. For a voltage biased detector, the energy deposited in the sensor by an incident particle or radiation is removed primarily through a reduction in feedback Joule heating.

The negative electrothermal feedback in a detector of the present invention is a direct consequence of voltage biasing resistive means 24 within its transition. If $R_{shunt}>R_{film}$, the sensor is current biased, and the electrothermal feedback becomes positive. If the sensor is current biased, the Joule power dissipated in resistor 24 increases following an event. In the limit of $R_{shunt}>>R_{film}$, the Joule power dissipated in resistor 24 as a function of the resistance $R_{film}$ approaches the line 46, where line 46 corresponds to perfect current biasing.

Figure 6:
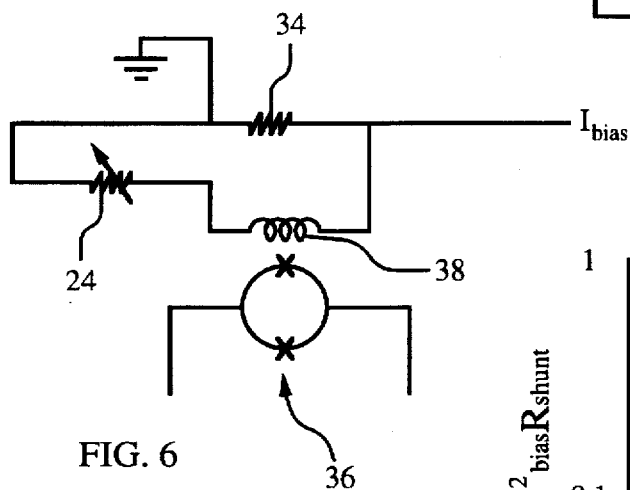
FIG. 6 is a schematic diagram similar to that of FIG. 4, showing the electrical equivalent of the resistive film.

Current sensing means 32 comprises a DC SQUID magnetometer 36, and a SQUID input coil 38. FIG. 6 shows schematically the electric circuit of a TES of the present invention. Resistive means 24 is effectively a variable resistor. A SQUID array can also be used as part of a current sensing means such as 32. Readout systems using SQUID arrays have a larger bandwidth than single-SQUID systems.

The geometry of the primary heat sink and the resistive means can be varied greatly. FIG. 7 shows another embodiment of this invention, having a resistive means 50 deposited on a substrate 52, with strips 54 connected in parallel between an input 56 and an output 58. The current sensing means is not shown for simplicity. The advantage of this arrangement is that each strip 54 self-biases independently within its transition, such that the effect of any gradient in $T_c$ across resistive means 50 is reduced.

FIG. 8-A and 8-B are perspective views from the top and bottom, respectively, of another preferred embodiment of the present invention, a TES 60. TES 60 comprises a substrate 62 acting as the primary heat sink, a resistive means 64 for measuring the energy of incident particles, a thermal conduction means 66, an absorber 68, and a thermal contact means 70 for providing contact between substrate 62 and a secondary heat sink (not shown). The secondary heat sink can be, for example, a dilution refrigerator.

FIG. 9-A is a view of a side section through the middle of TES 60. In the embodiment shown in FIG. 8-A, 8-B and 9-A, substrate 62 does not extend under resistive means 64, in order to minimize the detection of X-rays absorbed in the substrate. The heat flow from resistive means 64 to substrate 62 occurs through thermal conduction means 66. In an alternative embodiment shown in a side sectional view in FIG. 9-B, a resistive means 72 can extend over substrate 62 if increased heat flow to the substrate is required.

FIG. 10-A and 10-B are, respectively, top and side views of another embodiment of the present invention, a TES 80. TES 80 comprises a primary heat sink 82 with four legs 84, a resistive means 86 and thermal contact means 88. The geometry has been described previously in detail for a sensor without electrothermal feedback; a complete description can be found in the paper by McCammon et al. in *Nucl. Instr. Meth.*, v. A326, p. 157–165, 1995, which is hereby incorporated by reference. The design minimizes the heat flow away from the portion of primary heat sink 82 underneath resistive means 86.

It is often desirable for a TES to have a large surface area, especially for applications such as dark matter or neutrino searches. Simply increasing the resistive means area, however, is not possible without making the film heat capacity too large. A device that allows a significant increase in the effective detector surface area, without an increase in the heat capacity of the film, is the quasiparticle-trap-assisted electrothermal feedback transition edge sensor (QET). Such a device uses two superconductors with different energy gaps deposited on the sensor substrate. The high-gap superconductor is deposited as a large area pad and it forms a collector for collecting the energy of phonons from the substrate. The low-gap superconductor is placed in thermal contact with the large area pad, and its area is kept small, in order to reduce the heat capacity of the low-gap film. The low-gap film is voltage biased.

A particle interacting with the substrate releases phonons. The gap of the collector is chosen to be smaller than the energy of incident phonons. When phonons impinge on the collector they break Cooper pairs, forming quasiparticles. The quasiparticles relax to the gap edge, and they release a second set of phonons. If the energy of these phonons is also above the gap, they can create more quasiparticles. Any subgap phonons escape back into the substrate and are lost. The device geometry is chosen so that the time for quasiparticles to diffuse within the collector to the low-gap superconductor is short compared to the quasiparticle recombination time and the desired rise time.

If the low-gap superconductor is within its transition region it has many thermally excited quasiparticles and behaves much like a normal metal. Therefore, quasiparticles diffusing into the low-gap superconductor rapidly thermalize, rather than emitting phonons. The thermalization is due to electron-electron interactions with the quasiparticles.

FIG. 11 shows a sensor element 100 comprising a resistive means 102 and a plurality of collecting means 104 on a substrate 106, for use in a QET of the present invention. Collecting means 104 are preferably large-surface-area films made of a high-gap superconductor, such as Al. Resistive means 102 is preferably a W strip packed into a tight meander, in order to minimize any variation in $T_c$ across the strip. Resistive means 102 is connected to each of its corresponding collecting means 104 at equal intervals along the length of strip 102, in order to reduce the energy thermalization time. A set of bonding pads 108 provide electrical contact to a current sensing means (not shown). Bonding pads 108 are preferably made of Al, although other superconductors may also be used.

A detector can include a plurality of elements like element 100. FIG. 12 shows an arrangement of four elements 110 similar to element 100, deposited on a substrate 112. All four elements 110 are connected to a single current sensing means (not shown) through the bonding pads 114, and form one channel of the detector. It is possible to pack many more elements such as 110 onto a substrate. In a preferred embodiment, 200 elements such as 110 comprise one channel of the detector. The detector can also have many such channels, allowing detection of particle location in addition to particle energy.

The design of the primary heat sink can be optimized for different modes of operation of a TES of the present invention. For example, if a thin (~µm) silicon nitride substrate is used, most X-rays incident on the sensor will be absorbed directly in the superconducting film. On the other hand, if a thick (~mm) silicon nitride substrate is used, most X-rays will be absorbed in the substrate, generating phonons which are then absorbed by the superconducting film. Quasiparticle trapping strucures, such as that shown in FIG. 8, can be used with a thick substrate in order to increase the surface area of the sensor without increasing the heat capacity of the superconducting film. Alternatively, the primary heat sink can be a normal metal in thermal contact with the superconducting film.

It is important for the sensitivity of a TES of the present invention that the superconducting film be kept isothermal. The temperature is maintained uniform across the film by keeping the film normal resistance small. If the normal electrical resistivity (and implicitly, the thermal resistivity) of the superconducting film is too large, different sections of the film become effectively thermally decoupled, the film becomes thermally unstable forming normal and superconducting regions, and thus reducing the sensitivity of the sensor. If the optimum film resistance is too small to be measured directly with a SQUID, a superconducting transformer circuit can be used to optimize the performance of the sensor. Superconducting transformer circuits are well known in the art.

Basic methods, such as sputtering and etching, for fabricating devices such as those described above are also well known in the art. There are many ways to build such devices. The following examples are only particular ways to build detectors of the present invention, and should not be construed to limit the invention.

EXAMPLE 1

For the manufacture of a ETF-TES such as the one shown in FIG. 1, resistive means 24 is made by depositing a W film onto a Si block of dimensions 0.5 mm×10 mm×10 mm. The tungsten film is deposited by DC magnetron sputtering. W films sputtered onto silicon without a voltage bias deposit in the beta crystal phase, which has a superconducting transition near 1K. By sputtering with a negative 200 V DC bias, a W film was deposited with a 70 mK transition temperature, and a transition width of 2 mK. The tungsten film was photolithographically patterned into two 1.8 mm×1.8 mm squares, spaced 5 mm apart, center to center.

Thermal contact means 26 was made by evaporating a gold film onto the backside of the substrate. The evaporation was done through a mask with two slits 2.5 mm wide, 8.9 mm long, and spaced 6.35 mm apart, center to center. A strip of silicon directly underneath resistor 24 was thus left bare in order to increase the fraction of athermal phonons absorbed by resistor 24 rather than film 26. Gold-plated beryllium copper springs provide the thermal connection between the gold film and a cold plate (not shown). The value of shunt resistor 34 was chosen to be 20 mΩ.

EXAMPLE 2

In the embodiment shown in FIG. 8-A and 8-B, primary heat sink 62 is a Si block, and thermal conduction means 66 is a thin SiN membrane. The substrate is etched away under a section of the SiN membrane, and absorber 68 and resistive means 64 are deposited on the membrane above that section. Resistive means 64 is a thin bilayer, the top layer being made of Al, and the bottom layer of Ag. Absorber 68 is also a bilayer; the top layer of the absorber is made of Bi, while the bottom layer of Ag. Bi is particularly suited for use in a sensor designed for the detection of X-rays, since Bi has a high X-ray stopping power and a low heat capacity. Semimetals other than Bi can also be used, due to their generally low heat capacity.

EXAMPLE 3

For the manufacture of a QET similar conceptually to the one shown in FIG. 12, two channels were instrumented on a double-polished, 1 mm-thick, 1 cm×1 cm substrate made of high purity magnetic Czochralski silicon with resistivity ρ>2 KΩ cm. Each channel covered a 2 mm×4 mm area, centered on the chip, and spaced 5 mm apart center to center (not shown). Each channel comprises 200 elements similar to element 100. Each resistor similar to 102 is made of a W strip 2 µm wide, 800 µm long, and 30 nm thick, and has a normal resistance of ~6Ω. Each collector (quasiparticle trap) similar to 104 is 60 nm thick and 80 µm on a side and is made of Al. Since the gap of Al (2Δ~0.3 meV) is smaller than the mean athermal phonon energy (E~2 meV), incident athermal phonons create quasiparticles in the Al, which diffuse to the TES on a short timescale compared to the quasiparticle recombination time.

The device is fabricated in two metallization steps and two lithography steps. First, an Al film 60 nm thick is deposited on a bare Si substrate in a Balzers 450 dc magnetron sputtering system. Without breaking vacuum, a protective W film 30 nm thick is then deposited over the Al with a −200 V dc substrate bias. The composite film is photolithographically patterned and a two-step wet etch is used to define the collectors, which at this point are still covered with 30 nm of W. The wafer is returned to the Balzers system for a second metallization. After the system is baked out, a rf backsputter is conducted to remove all of the surface oxide. Since the patterned Al is covered by a layer of W, it is expected that little Al is backsputtered onto the Si surface during this process. A fresh W film 30 nm thick is then deposited on the wafer, again using a −200 V dc substrate bias. The W resistor stripes and the connections to the collectors are then photolithographically patterned, and all the excess W is removed using a wet etch. The wafers are then diced into 1 cm×1 cm squares and mounted in a dilution refrigerator system with a 35 mK base temperature.

EXAMPLE 4

Figure 13:
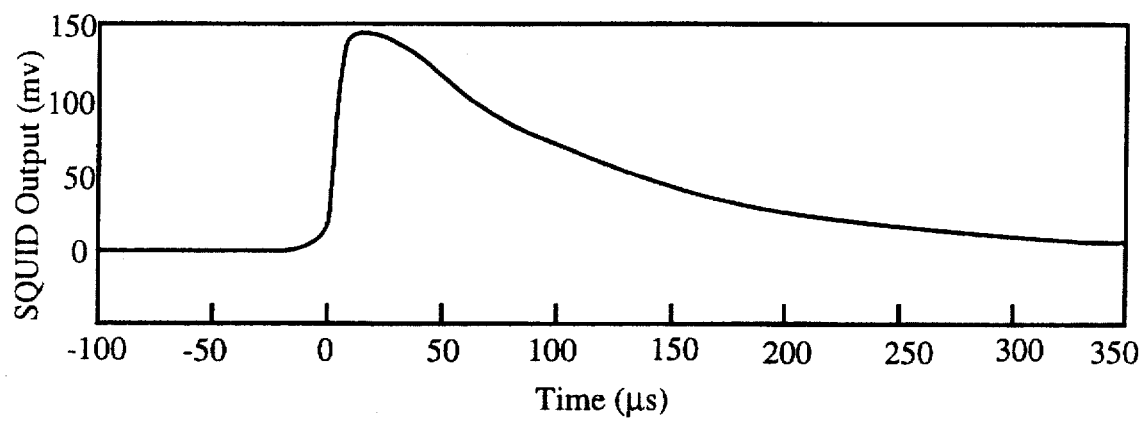
FIG. 13 shows the output of a SQUID array connected to one channel of a QET of the present invention.
Figure 14:
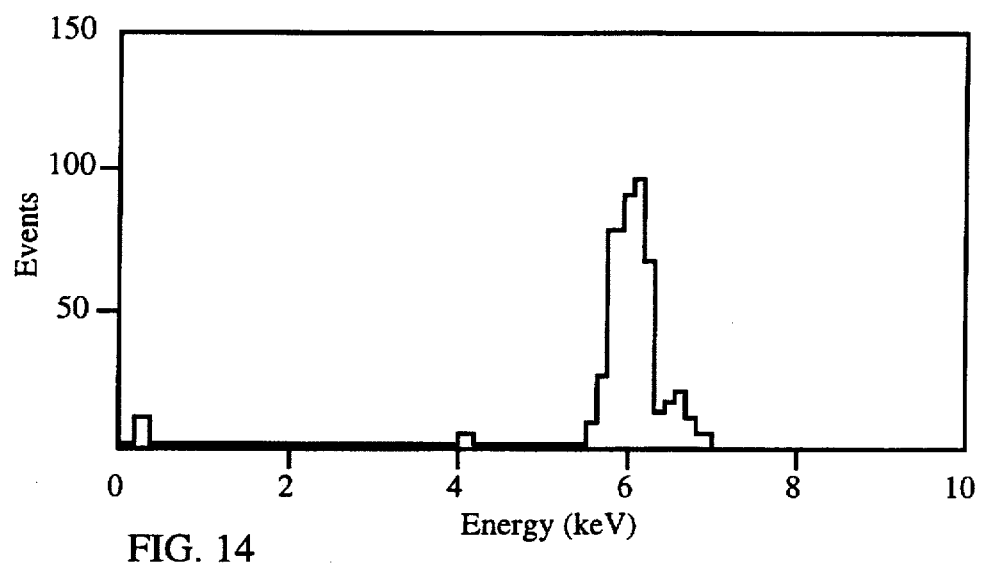
FIG. 14 is a histogram of the energies of X-rays emitted by a $^{55}$Fe source, measured with a QET of the present invention.

A $^{55}$Fe source of 5.89 and 6.49 keV x-rays was used with a QET made as described in Example 3. The source was mounted on the backside of the substrate. The 1/e attenuation lengths of 5.89 and 6.49 keV X-rays in Si are ~29 μm and ~38 μm, respectively, so most events occur near the surface of the 1 mm-thick Si crystal. The X-rays were collimated with a slit (not shown) onto the detector. In order to improve the energy resolution of the sensor, the Si crystal was irradiated with a photodiode for 10 minutes before data was taken. A sample output of the SQUID readout from one of the sensor channels is shown in FIG. 13. The energy of an incident particle was taken to be equal to the integral of the reduction in Joule heating, summed over both channels. FIG. 14 shows a normalized histogram of the energy of incident radiation. The main energy peak is normalized to 6 keV. Both the separation of the peaks and the ratio of the number of events in the two peaks are consistent with the $K_\alpha$ (5.9 keV) and Kβ (6.5 keV) X-rays from the $^{55}$Fe source. The energy resolution is measured to be <350 eV FWHM, which is the highest resolution that has been reported with a fast (<1 ms pulse duration) calorimetric detector with an absorber mass larger than 0.1 g.

SUMMARY, RAMIFICATIONS, AND SCOPE

A novel type of superconducting transition edge sensor using electrothermal feedback is described. Although a Si substrate is a convenient example of a primary heat sink, in general the primary heat sink need not be a substrate. The geometry of the primary heat sink can be used to control the heat flow to and/or from the primary heat sink. An absorber may be used with a sensor of the present invention. The absorber can include a normal metal or a semimetal, a superconductor, a substrate or any material suited for the absorption of the radiation or particles of interest. The absorber can also act as the primary heat sink, as in the detector described in Example 1. In general, normal metal or semimetal absorbers are better suited for the detection of lower energy radiation, while superconductor or semiconductor crystal absorbers are suited for the detection of higher energy radiation. An absorber is not necessary in all applications: for the detection of optical photons for example, the incident radiation can be absorbed directly in the resistive means. The geometry and composition of the resistive means can also be varied in order to control thermal and athermal interactions with the primary heat sink and/or the absorber.

There are many ways to build a transition edge sensor using electrothermal feedback, without departing from the spirit of the invention. Therefore, the scope of the invention should be determined not by examples given, but by the appended claims and their legal equivalents.

We claim:

1. A superconducting sensor for measuring an energy pulse, said sensor comprising:

a) a resistive means comprising a first superconductive material, said resistive means having a superconducting transition temperature $T_c$ and a superconducting transition sharpness α larger than 1;

b) a primary heat sink being maintained at a temperature $T_s$, where $T_s<T_c$;

c) a voltage bias means in electrical contact with said resistive means for maintaining a bias voltage V across said resistive means, said voltage V being chosen such that the temperature of said resistive means is maintained through negative electrothermal feedback within the superconducting transition of said resistive means;

d) a current sensing means for measuring the current passing through said resistive means, said current sensing means being electrically connected to said resistive means;

whereby said energy pulse is determined from the variation in the current through said resistive means, said variation in current resulting from thermal changes in said resistive means caused by said energy pulse.

2. The sensor of claim 1, wherein said current sensing means comprises a SQUID.

3. The sensor of claim 2, wherein said current sensing means comprises a SQUID array.

4. The sensor of claim 1, wherein said primary heat sink comprises a substrate.

5. The sensor of claim 4, wherein said substrate comprises a Si block.

6. The sensor of claim 1, further comprising an absorber in thermal contact with said resistive means.

7. The sensor of claim 6, wherein said absorber comprises a Bi-Ag bilayer.

8. The sensor of claim 1, wherein said resistive means comprises a thin film.

9. The sensor of claim 8, wherein said primary heat sink comprises a substrate, and said thin film is deposited on said substrate.

10. The sensor of claim 8, wherein said thin film is made of tungsten.

11. The sensor of claim 8, wherein said thin film comprises a bilayer, said bilayer comprising a superconducting material and a normal material.

12. The sensor of claim 1, further comprising a secondary heat sink in thermal contact with said primary heat sink.

13. The sensor of claim 12, further comprising a thermal contact means for providing thermal contact between said primary heat sink and said secondary heat sink.

14. The sensor of claim 13, wherein said thermal contact means comprises a thermally conducting film deposited on said primary heat sink.

15. The sensor of claim 1, wherein said energy pulse is measured by the time integral of the change in Joule power dissipated in said resistive means.

16. The sensor of claim 1, further comprising a collecting means in thermal contact with said primary heat sink and with said resistive means, said collecting means comprising a second superconductive material, the energy gap of said second superconductive material being higher than the energy gap of said first superconductive material.

17. The sensor of claim 16, wherein said primary heat sink comprises a substrate, said resistive means comprises a first thin film deposited on said substrate, and said detective means comprises a second thin film deposited on said substrate.

18. The sensor of claim 16, said sensor comprising a plurality of said resistive means and a plurality of said collecting means, each of said resistive means being in thermal contact with a corresponding said collecting means.

19. The sensor of claim 18, wherein said plurality of resistive means are arranged in a two-dimensional array on said substrate.

20. A method for measuring an energy pulse, said method comprising the steps of:

a) establishing a resistive means in thermal equilibrium within its superconducting transition by placing said resistive means in thermal contact with a primary heat sink maintained at a temperature lower than the superconducting transition temperature of said resistive means, and by applying a voltage bias V across said resistive means, where V is selected such that the temperature of said resistive means is maintained through negative electrothermal feedback within said superconducting transition; and b) measuring a change in the feedback current flowing through said resistive means.

* * * * *

UNITED STATES PATENT AND TRADEMARK OFFICE
CERTIFICATE OF CORRECTION

PATENT NO.   : 5,641,961
DATED        : June 24, 1997
INVENTOR(S)  : Kent D. Irwin and Blas Cabrera It is certified that error appears in the above-identified patent and that said Letters Patent is hereby corrected as shown below:

Column 1, between lines 4 and 5,
                  insert "This invention was supported in part by grant number DE-FG03-90ER40569 from the Department of Energy (DOE). The Government has certain rights in the invention."

Signed and Sealed this

Seventh Day of October, 1997

*Attest:*

BRUCE LEHMAN

*Attesting Officer*    *Commissioner of Patents and Trademarks*